United States Patent [19]
Yokobori et al.

[11] 4,395,682
[45] Jul. 26, 1983

[54] DIFFERENTIAL OUTPUT CIRCUIT

[75] Inventors: Nobuyoshi Yokobori, Osaka; Tetsuo Maeda, Neyagawa; Yoshiaki Igarashi, Ikoma, all of Japan

[73] Assignee: Matsushita Electric Industrial Co., Ltd., Osaka, Japan

[21] Appl. No.: 220,722

[22] Filed: Dec. 29, 1980

[30] Foreign Application Priority Data

Dec. 28, 1979 [JP] Japan ............................. 54-172555

[51] Int. Cl.³ .............................................. H03F 3/45
[52] U.S. Cl. .................................................. 330/260
[58] Field of Search ...................... 330/252, 297, 260

[56] References Cited
FOREIGN PATENT DOCUMENTS
1966901 5/1975 Fed. Rep. of Germany ...... 330/252

Primary Examiner—James B. Mullins
Assistant Examiner—Gene Wan
Attorney, Agent, or Firm—Wenderoth, Lind & Ponack

[57] ABSTRACT

A differential output circuit for generating a bipolar DC current for an armature winding without requiring a bipolar power source. A combination of transistors and resistors are utilized to effectively apply a bipolar driving current. The use of only transistors and resistors in the differential output circuit enables its easy implementation as an integrated circuit.

5 Claims, 11 Drawing Figures

DIFFERENTIAL OUTPUT CIRCUIT

BACKGROUND OF THE INVENTION

This invention relates to a differential output circuit. An embodiment of the invention will be described relative to an output circuit for driving a brushless DC motor, and especially to a full wave drive output circuit.

A drive circuit for a brushless motor may be divided into half-wave drive circuits and full wave drive circuits. The half-wave drive causes a unidirectional DC current to flow in each armature winding to generate torque. The full-wave drive circuit causes a DC current to flow in the normal and reverse directions in each armature winding so as to thereby generate torque.

Conventionally, in the full-wave drive circuit case, each armature winding is provided with a common terminal so that positive and negative power sources, with respect to the common terminal, respectively feed currents in the normal and reverse directions to the armature winding.

FIG. 1 shows a conventional example of a two-phase full-wave drive circuit, in which armature windings 9 and 15 are grounded at the common terminals and supply voltages $+V_{cc}$ and $-V_{cc}$ are supplied to the circuit.

In FIG. 1, armature windings 9 and 15 are positioned in a relationship of being mutually shifted by an electrical angle of 90°. With respect to the respective windings, Hall generators 3 and 11 are disposed for detecting the rotor position. The Hall generators 3 and 11, as shown in FIG. 2, generate output voltage 16 and 17 which are shifted in phase by 90° and following the rotation of the rotor. The outputs are amplified by amplifiers 6 and 12 so as to be proportional to voltages at both ends of armature windings 9, 15 by means of a feedback circuit. Hence, voltage wave forms at terminals 8, 14 of armature windings 9, 15 with respect to ground terminals become similar to wave forms of the output voltages 16, 17. Other than the phase relation, both two phases act similarly, whereby the following description will concern single phase.

When terminal 8 of armature winding 9 is positive, transistor $Q_{101}$ is active and $Q_{102}$ is cut-off, and when negative, transistor $Q_{102}$ is active and $Q_{101}$ is cut-off to thereby respectively cause the flow of normal and reverse currents. In other words, the ground terminals act as the neutral point with respect to the positive and negative power sources. In this instance, only one power source is used once notwithstanding the fact that both positive and negative power sources are required with respect to the neutral point. Hence, there is a defect of reducing the voltage utility percentage of the single power supply to half.

SUMMARY OF THE INVENTION

The object of the present invention is to provide a differential output circuit for generating a bipolar DC current in an armature winding without requiring a bipolar power source.

BRIEF DESCRIPTION OF THE DRAWINGS

To completely eliminate the abovenoted defect of the prior art, this invention has been designed. The present invention will be discussed below in detail in accordance with the accompanying drawings, in which:

FIG. 3 through FIG. 11 show embodiments of the invention, in which

FIG. 3 is a circuit diagram of an output circuit thereof;

FIG. 4 is a view explanatory of the output circuit using switches to be changed-over;

FIG. 5 is a block diagram of an output circuit using an integrated circuit;

FIG. 6 is a block diagram of an output circuit using current mirrors;

FIG. 7 is a block diagram of an output circuit using NPN transistors for switches;

FIG. 8 is a block diagram of an output circuit using composite transistors for switches, FIG. 9 is a view explanatory of the circuit in FIG. 8;

FIG. 10 is a view explanatory of the output circuit using switches to be changed-over; and FIG. 11 is a block diagram of an output circuit using a load current detecting resistor.

DESCRIPTION OF THE PREFERRED EMBODIMENTS

Figure 1:
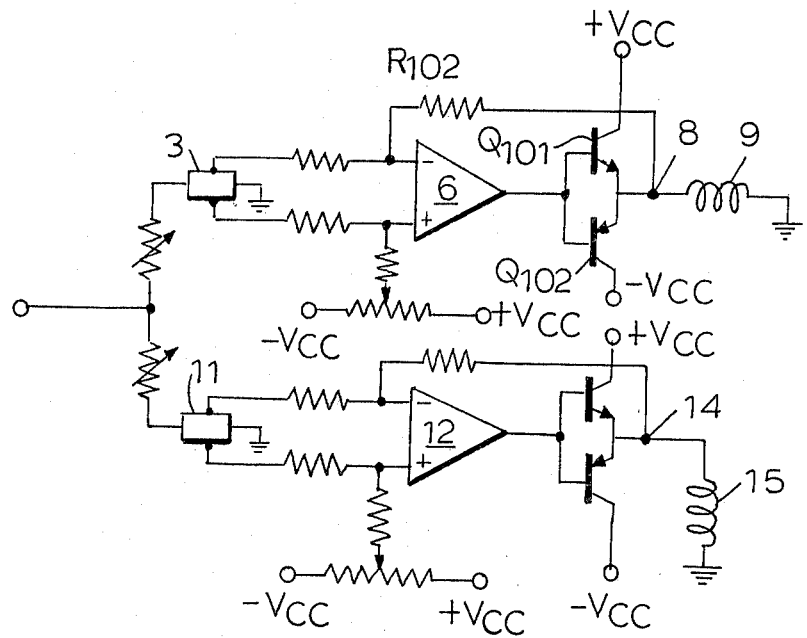
FIG. 1 is a block diagram of a conventional brushless motor drive circuit employing an output circuit having a neutral point.
Figure 2:
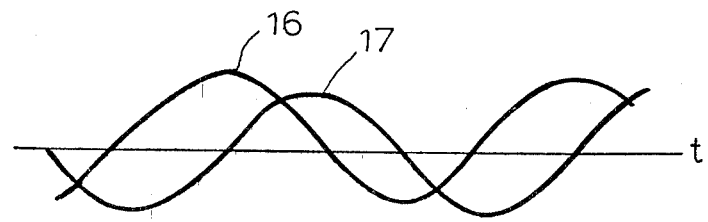
FIG. 2 is a view showing waveforms of a rotor position detecting Hall generator and an armature winding.
Figure 3:
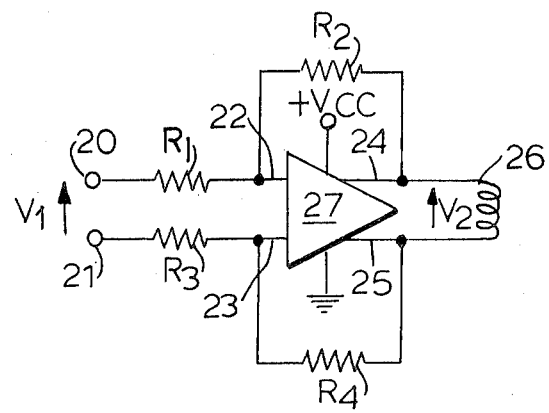

FIG. 3 shows an embodiment of a differential output circuit of this invention, in which input terminals 20 and 21 are respectively connected to inputs 22 and 23 of two-phase differential amplifier 27 by way of resistors $R_1$ and $R_3$. Two-phase outputs 24 and 25 of two-phase differential amplifier 27 are respectively fed back to the inputs 22 and 23 through resistors $R_2$ and $R_4$. A load is connected between outputs 24 and 25, e.g., armature winding 26. Supply voltage $+V_{cc}$ is supplied to the two-phase differential amplifier 27. The relationship between the input and the output of the two-phase differential amplifier 27 is such that output 24 has an inverse polarity with respect to input 22 and the output 25 has an inverse polarity with respect to input 23. Hence, the feedbacks by resistors $R_2$ and $R_4$ are both negative. Assuming that the voltage between input terminals 20 and 21 is defined to be $V_1$ and the voltage between outputs 24 and 25 is defined to be $V_2$, the following equation between $V_1$ and $V_2$ should hold when the gain of the two-phase differential amplifier 27 is high enough:

$$V_2 = -\frac{1}{2}\left(\frac{R_2}{R_1} + \frac{R_4}{R_3}\right) V_1$$

If $$\frac{R_2}{R_1} = \frac{R_4}{R_3},$$

then $$V_2 = -\frac{R_2}{R_1} V_1.$$

Hence, $V_2$ is proportional to $V_1$ and a current in the normal or reverse direction flows in the load 26 correspondingly to either plus $V_1$ or minus $V_1$. Since, load 26 is not provided with a common terminal corresponding to the neutral point, the supply voltage is supplied thoroughly effectively to the load.

Figure 4:
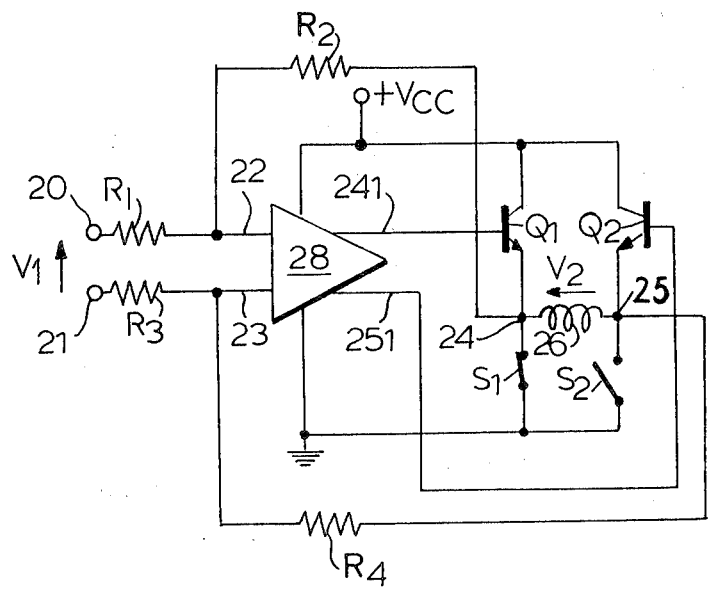

A modified embodiment of the invention is shown in FIG. 4, in which either output 24 or 25 is grounded alternatively by switch $S_1$ or $S_2$ and the other output which is not grounded actively constitutes a negative feedback circuit. Outputs 24 and 25 of two-phase differential amplifier 28 corresponding to the two-phase differential amplifier 27 have the correct polarity to be fed back to inputs 22 and 23 through transistors $Q_1$ and $Q_2$ and resistors $R_2$ and $R_4$.

The two following circuits are constructed in dependence upon how the switches $S_1$ and $S_2$ are switched.

(a) When output 241 makes transistor $Q_1$ active, switch $S_1$ is simultaneously opened, at which time output 251 is in a condition to turn off transistor $Q_2$ and simultaneously switch $S_2$ is closed. On the other hand, when output 251 makes transistor $Q_2$ active, switch $S_2$ is simultaneously opened, and output 241 turns off transistor $Q_1$ and simultaneously close switch $S_1$ is closed.

(b) When output 241 makes transistor $Q_1$ active, switch $S_2$ is simultaneously closed, at which time output 251 is in a condition to turn off transistor $Q_2$ and simultaneously switch $S_1$ is opened. On the other hand, when output 251 makes transistor $Q_2$ active, switch $S_1$ is closed and when output 241 turns-off transistor $Q_1$, simultaneously switch $S_2$ is opened.

In either case (a) or (b) above, the same effect is obtained. In other words, referring to FIG. 4, when the voltage $V_1$ between the input terminals 20 and 21 is positive (in the condition of keeping input terminal 20 higher in voltage than input terminal 21), transistor $Q_1$ is off and switch $S_1$ is closed. In this instance, only the transistor $Q_2$ is active; hence, assuming that the gain of two-phase differential amplifier 28 is high enough, the following relationship is obtained between the input voltage $V_1$ and the output voltage $V_2$:

$$V_2 = -\frac{R_3 + R_4}{R_3} \left( \frac{R_2}{R_1 + R_2} V_1 + \left( \frac{R_2}{R_1 + R_2} - \frac{R_4}{R_3 + R_4} \right) V_0 \right),$$

where $V_o$ = the voltage at input terminal 21. If $$\frac{R_2}{R_1} = \frac{R_4}{R_3},$$

then $$V_2 = -\frac{R_2}{R_1} V_1.$$

On the other hand, when the voltage between the input terminals 20 and 21 is negative, transistor $Q_2$ is off, and switch $S_2$ is simultaneously closed, thereby forming a negative feedback circuit with transistor $Q_1$. In this instance, if the same assumption as that noted above is made with respect to resistors $R_1$, $R_2$, $R_3$ and $R_4$, the relationship between $V_1$ and $V_2$ is always:

$$V_2 = -\frac{R_2}{R_1} V_1 \tag{1}$$

thereby keeping a linear operation.

Consequently, the switch $S_1$ or $S_2$ is switched correspondingly to input voltage $V_1$ and the output voltage $V_2$ always becomes $$V_2 = -\frac{R_2}{R_1} V_1,$$

so that currents in the normal and reverse directions flow in load 26. Since the supply voltage, as seen from the above, is supplied to a load through transistor $Q_1$ or $Q_2$, the supply voltage as a whole is always in effective use.

In the description of FIGS. 3 and 4, the assumption of $$\frac{R_2}{R_1} = \frac{R_4}{R_3}$$

is introduced between resistors $R_1$ through $R_4$, and the assumption is easy to realize especially when this invention is practically applied to an integrated circuit. The reason for this is that in an integrated circuit, it is possible to arrange the proportionality of resistors on the same chip with a high accuracy.

Figure 5:
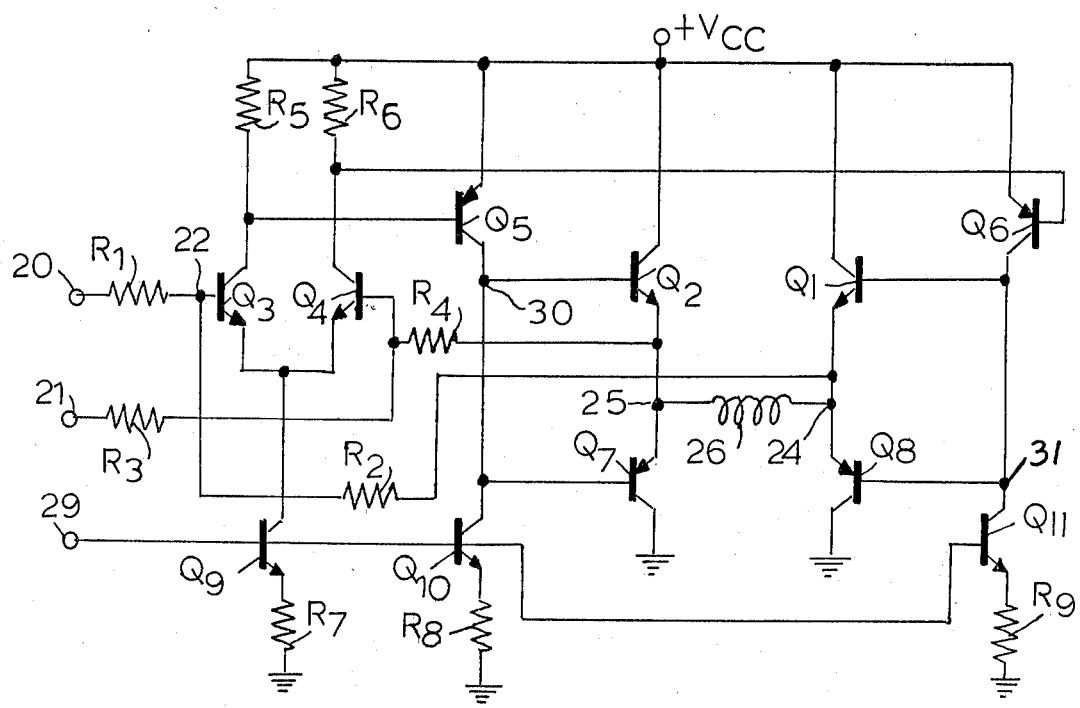

FIG. 5 shows an embodiment of this invention, which is applied to an integrated circuit. In a case (a), transistors $Q_3$ and $Q_4$ constitute a differential amplifier, in which the transistors have their emitters connected in common. Base 22 of the transistor $Q_1$ is connected to input terminal 20 through resistor $R_3$ and base 23 of transistor $Q_4$ is connected to input terminal 21 through resistor $R_3$. The collectors of transistors $Q_3$ and $Q_4$ are respectively connected to power source $+V_{cc}$ through resistors $R_5$ and $R_6$. PNP transistors $Q_5$ and $Q_6$, whose emitters are connected to power source $+V_{cc}$, have their bases respectively connected to the collectors of transistors $Q_3$ and $Q_4$. The collectors of transistors $Q_5$ and $Q_6$ are respectively connected to the bases 30 and 31 of transistors $Q_2$ and $Q_1$ whose collectors are connected to the power source. The bases and emitters of PNP transistors $Q_7$ and $Q_8$, whose collectors are grounded, are respectively connected in common to the bases and emitters of transistor $Q_2$ and $Q_1$, and the common emitters of transistors $Q_2$ and $Q_7$ constitue the output 25 and the common emitters of transistors $Q_1$ and $Q_8$ constitute the output 24, so that load 26 is interconnected between said outputs 24 and 25. The outputs 24 and 25 are respectively connected to bases 22 and 23 of transistors $Q_3$ and $Q_4$ through resistors $R_2$, $R_4$. The emitters of transistors $Q_9$, $Q_{10}$, and $Q_{11}$, whose bases are connected in common to bias terminal 29, are grounded through resistors $R_7$, $R_8$, and $R_9$, thereby constituting a constant current source. The collector of transistor $Q_9$ is connected to the common emitters of transistors $Q_3$ and $Q_4$. The collectors of transistors $Q_{10}$ and $Q_{11}$ are respectively connected to the bases 30 and 31 of transistors $Q_2$ and $Q_1$. The collector currents of transistors $Q_{10}$ and $Q_{11}$ are set so that the emitter current of switching transistor $Q_7$ or $Q_8$ when turned on, becomes a desired load current. The collector current of transistor $Q_9$ is so set that the collector currents of transistors $Q_5$ and $Q_6$, when the collector currents of transistors $Q_3$ and $Q_4$ are equal, become respectively equal to or slightly smaller than the collector currents of transistors $Q_{10}$ and $Q_{11}$.

In the aforesaid construction, if we assume that $$\frac{R_2}{R_1} = \frac{R_3}{R_4},$$

when the input terminals 20 and 21 are equal in voltage, then transistors $Q_1$ and $Q_2$ are both become off, whereby both transistors $Q_7$ and $Q_8$ are off or in the condition of being slightly on.

At this time, if the voltage at input terminal 20 is made higher than that of input terminal 21, then transistor $Q_3$ increases in its collector current more than transistor $Q_4$ differentially. Hence, the collector current of transistor $Q_5$ becomes larger than that of transistor $Q_{10}$, and transistor $Q_7$ is off so as to make transistor $Q_2$ active. At the same time, the collector current of transistor $Q_6$ decreases so as to be further smaller than that of transistor $Q_{11}$, whereby, since transistor $Q_1$ is off, transistor $Q_6$ increases its base current so as to be in a condition of being further on. Thus, output 24 is grounded through transistor $Q_8$, so that the supply voltage $+V_{cc}$ as a whole is fed to load 26. SInce output terminal 25 is in negative feedback through resistor $R_4$, the voltage at both ends of load 26 is proportional to the input so as to thereby satisfy the equation 1.

On the other hand, when the voltage at input terminal 20 is smaller than that at input terminal 21, the collector current of transistor $Q_4$ becomes larger than that of transistor $Q_3$. As a result, the collector current of transistor $Q_6$ increases and that of transistor $Q_5$ decreases. Hence, transistor $Q_8$ is off so as to make transistor $Q_1$ active and transistor $Q_2$ is off so that transistor $Q_7$ is in condition of being further on. Output terminal 25 is grounded through transistor $Q_7$ and output terminal 24 is put in the negative feedback through resistor $R_2$, whereby the voltage at both ends of the load 26 is also proporational to the input, thereby also satisfying the equation 1.

Consequently, output terminal 24 or 25 is alternatively grounded by switching transistors $Q_7$ or $Q_8$ in correspondence with the input voltage, thereby effectively using the whole supply voltage to enable the supply of currents in the normal and reverse directions to load 26.

Figure 6:
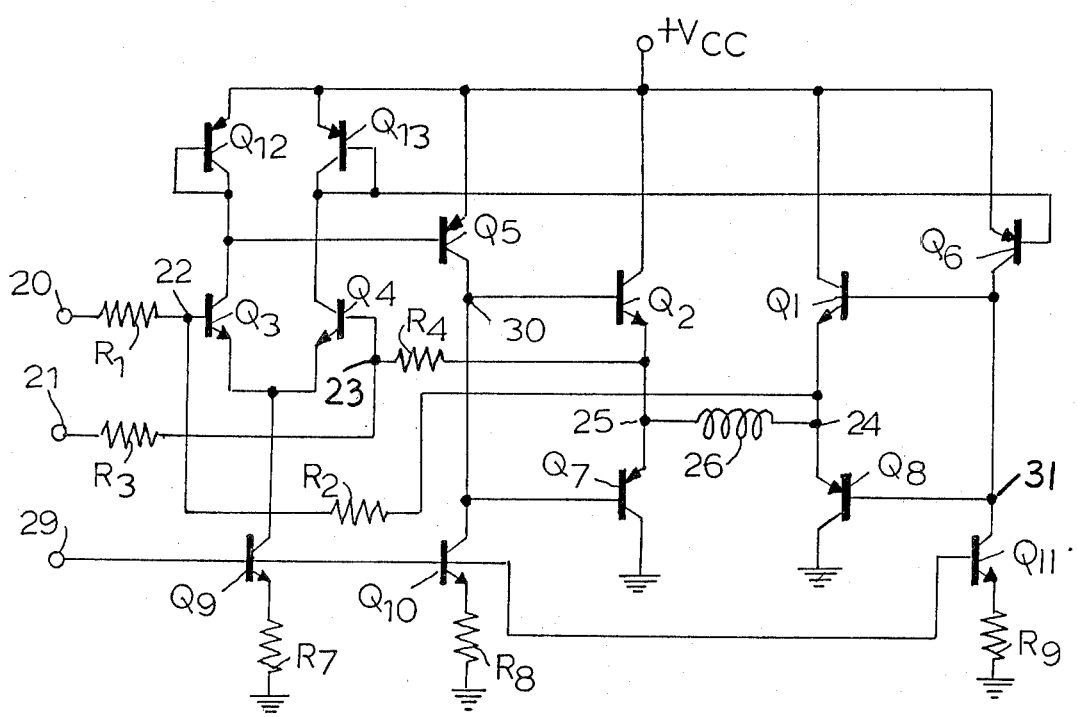

FIG. 6 shows another modified embodiment corresponding to FIG. 5, in which resistors $R_5$ and $R_6$ in FIG. 5 are respectively replaced by diodes $Q_{12}$ and $Q_{13}$, (the diodes $Q_{12}$ and $Q_{13}$ shown as diode connected transistors), so that combination of transistor $Q_5$ with diode $Q_{12}$ and that of transistor $Q_6$ with diode $Q_{13}$, respectively constitute current mirrors. This embodiment operates in the same fashion as in the embodiment shown in FIG. 5.

Figure 7:
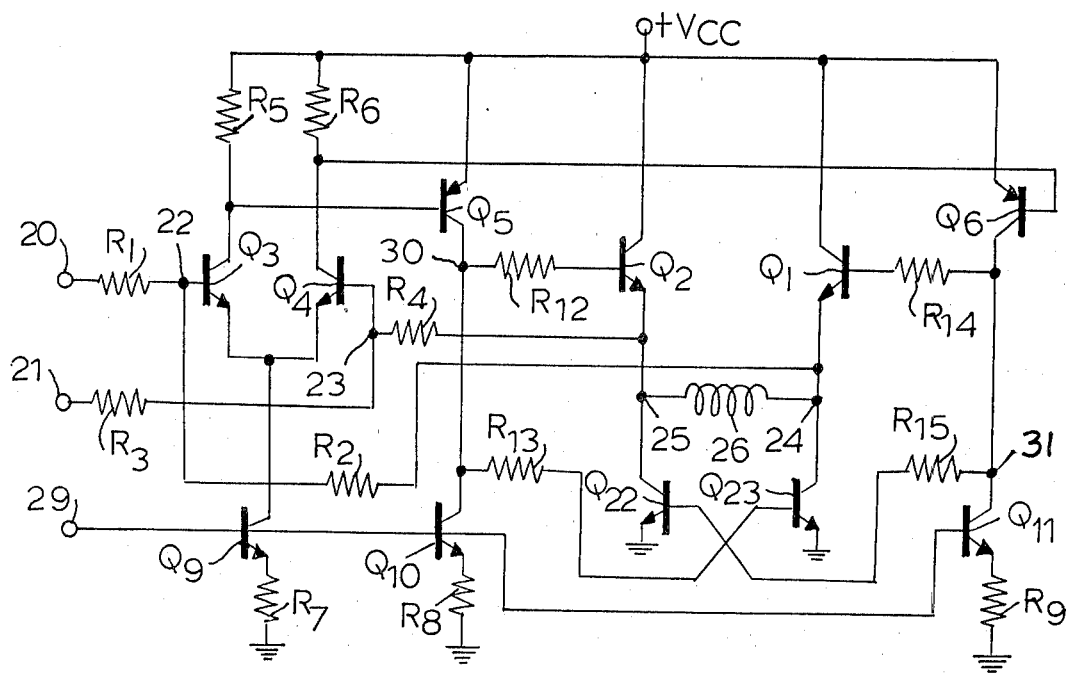

FIG. 7 shows another modified embodiment in the aforesaid case (b), in which transistors $Q_7$ and $Q_8$ in FIG. 5 are respectively replaced by NPN transistors $Q_{22}$ and $Q_{23}$; the emitter of transistor $Q_{22}$ is grounded and its collector is connected to an output terminal 25 and its base is connected to the collector 31 of transistor $Q_6$ through resistor $R_{15}$. Transistor $Q_{23}$ has its emitter grounded, its collector connected to output terminal 24, and its base connected to collector 30 of transistor $Q_5$ through a resistance $R_{13}$. The bases of transistors $Q_1$ and $Q_2$ are respectively connected to collectors 31 and 30 through resistors $R_{14}$ and $R_{12}$. The constant current source transistors $Q_9$, $Q_{10}$ and $Q_{11}$ are set as follows:

When the collector currents of transistors $Q_3$ and $Q_4$ are equal, resistances $R_7$, $R_8$ and $R_9$ are so set that the collector currents of transistors $Q_5$ and $Q_6$ are respectively equal to or slightly more than those of transistors $Q_{10}$ and $Q_{11}$. When either transistor $Q_3$ or $Q_4$ is off, transistor $Q_5$ or $Q_6$ drives transistor $Q_2$ or $Q_1$ to set the collector current of transistor $Q_9$ so that the load 26 is supplied with its required current. In this instance, when voltage at input terminal 20 is higher than that an input terminal 21, the collector current of transistor $Q_5$ become more than that of transistor $Q_{10}$, thereby making transistor $Q_2$ and $Q_{23}$ active. The selection of the values of resistors $R_{12}$ and $R_{13}$ enables transistor $Q_{23}$ to be saturated, whereby output terminal 24 is grounded through transistor $Q_{23}$ and output terminal 25 leads to linear operation by the negative feedback circuit. In an inverse relationship of the voltage at the input terminals, the effect of the invention can be expressed by the same description as that noted above. In addition, the embodiment in FIG. 7 also is suitable for manufacturing as an integrated circuit.

Figure 8:
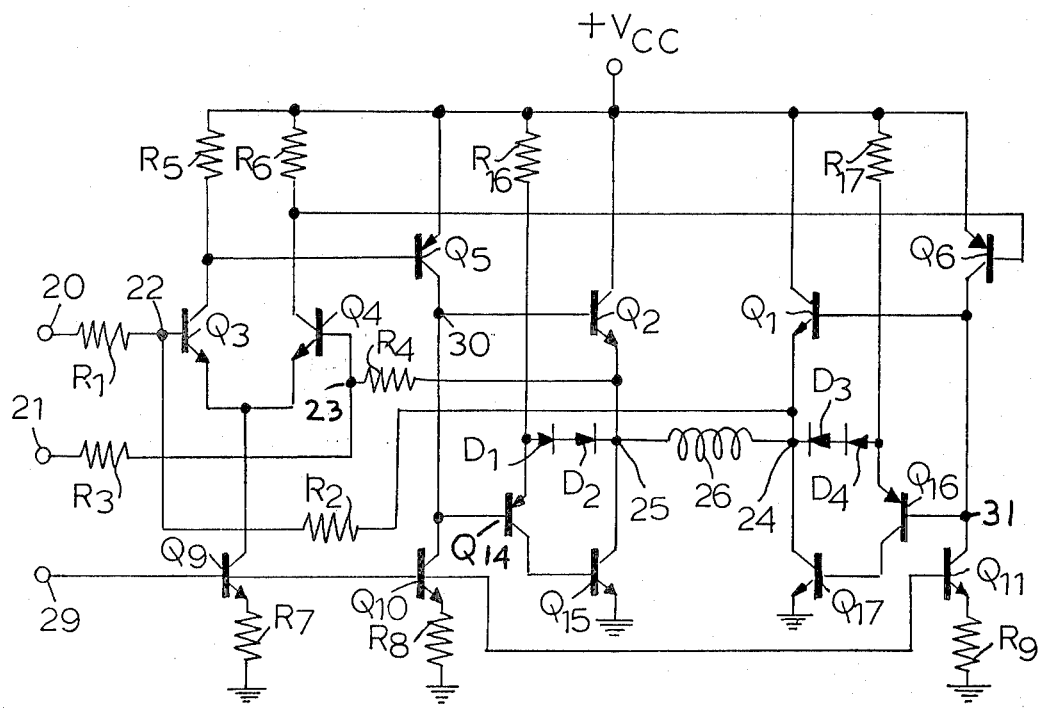

FIG. 8 shows a further modified embodiment, in which the PNP switching transistors $Q_7$ and $Q_8$ in FIGS. 5 and 6 respectively employ composite transistors. In FIG. 8, the base of PNP transistor $Q_{14}$ is connected to the collector of transistor $Q_5$, the collector of transistor $Q_{14}$ is connected to the base of NPN transistor $Q_{15}$, and the emitter of transistor $Q_{14}$ is connected to the power source $+V_{cc}$; the emitter of transistor $Q_{15}$ is grounded its collector is connected to output terminal 25. Furthermore, one or more series diodes $D_1$ and $D_2$ are connected so that their anode is connected to the emitter of transistor $Q_{14}$ and their cathode is connected to output terminal 25. The base of PNP transistor $Q_{16}$ is connected to the collector of transistor $Q_6$, the collector of transistor $Q_{16}$ is connected to the base of NPN transistor $Q_{17}$, and the emitter of transistor $Q_{16}$ is connected to power source $+V_{cc}$ through resistor $R_{17}$; the emitter of transistor $Q_{17}$ is grounded and its collector is connected to output terminal 24. Furthermore, one or more series diodes $D_3$ and $D_4$ are connected so that their anode is connected to the emitter of transistor $Q_{16}$ and their cathode is connected to output terminal 24. In this instance, transistors $Q_{15}$ and $Q_{17}$ act as the switching transistors. The operation of $Q_{14}$ and $Q_{15}$ when on, will be described with reference to FIG. 9. If the series forward voltage of diodes $D_1$ and $D_2$ which are forward biased by resistor $R_{16}$, is expressed by $V_D$, and the collector voltage of transistor $Q_{15}$ is expressed by $V_S$, and the base voltage of transistor $Q_{14}$ expressed by $V_A$, and the voltage between emitter and base of transistor $Q_{14}$ expressed by $V_B$, then the following equation is obtained:

$$V_A = V_S + V_D - V_B \geqq V_S$$

Accordingly, the inequality $V_A > 0$, even in a fully saturated condition of transistor $Q_{15}$, allows the constant current source transistor $Q_{10}$ not to be saturated, thereby sufficiently driving the base of transistor $Q_{14}$. In other words, output terminal 25 is grounded through transistor $Q_{15}$, so that output terminal voltage is sufficiently lowered, thereby effectively utilizing the supply voltage. Especially in an integrated circuit, it is possible to interpose resistors between the base and the emitter of the respective transistors $Q_{15}$ and $Q_{17}$ in order to prevent a malfunction in transistors $Q_{15}$ and $Q_{17}$ caused by leakage current. Furthermore, a constant current source may be used instead of resistors $R_{16}$ and $R_{17}$ to bias diodes $D_1$ through $D_4$ to thereby obtain the same effect.

In FIG. 4, switches $S_1$ and $S_2$ are interposed between the outputs 24 and 25 and the negative side of power source. Alternatively, switches $S_3$ and $S_4$ are interposed between the outputs corresponding respectively thereto and the positive side of power source, and transistors $Q_{18}$ and $Q_{19}$ are used, thereby obtaining a similarly operable construction (see FIG. 10).

FIG. 11 shows a still further modified embodiment which can detect a load current, in which transistors $Q_1$ and $Q_2$ respectively correspond to transistors $Q_1$ and $Q_2$ in FIG. 5, but the collectors of both transistors are connected in common and to power source $+V_{cc}$ through resistor $R_{10}$, whereby the current values in the normal and reverse direction with respect to load 26 can be detected as the voltage across the ends 32 and 33 of resistor $R_{10}$, that is, the absolute value of the load current is detectable. Alternatively, the collectors of the transistors are connected directly to power source $+V_{cc}$, and a resistor $R_{10}$ is interposed between the joint of common collectors of transistors $Q_7$ and $Q_8$ and ground, thereby apparently obtaining the same effect as in FIG. 11.

In addition, it is of sourse possible to apply various transformations to the transistor's conductivity, polarity of power cource, and the number of stages of amplification, without changing the principle of the invention, or to form other embodiments of these transformations.

As seen from the above description, the differential output circuit of the invention, even when applied to output circuits of other electronic circuits, can feed current to the load in the normal or reverse direction with only a single power source the use of the two-phase differential amplifier and negative feedback circuit, thereby having the effect of simultaneously using the whole supply voltage and being of an extremely high industrial value.

What is claimed is:

1. A differential output circuit comprising: a two-phase differential amplifier which has a first output which changes its output voltage in response to a voltage applied to a first input and has a second output which changes its output voltage in response to a voltage applied to a second input, said differential amplifier being driven by a single power source; a load which is connected between said first and second outputs, said first output and first input being connected together by a first negative feedback resistor, said second output and second input being connected together by a second negative feedback resistor; a first resistor and a second resistor are respectively connected at one end thereof with said first and second inputs; wherein said load is supplied with current flowing either in a normal or reverse direction according to the polarity of a potential difference between the other ends of said first and second resistors.

2. A differential output circuit according to claim 1, further comprising first and second switches which are respectively interposed between said first and second outputs and a negative pole of said power source, wherein said first and second switches are driven so as to connect said first output with said negative pole of said power source when said potential difference between the other ends of said first and second resistors is positive or zero, and are driven so as to connect said second output with said negative pole of said power source when said potential difference is negative or zero.

3. A differential output circuit according to claim 1, further comprising third and fourth switches which are respectively interposed between said first and second outputs and a positive pole of said power source, wherein said third and fourth switches are driven so as to connect said second output with said positive pole of said power source when said potential difference between the other ends of said first and second resistors is positive or zero, and driven so as to connect said first output with said positive pole of said power source when said potential difference is negative or zero.

4. A differential output circuit according to claim 2 or claim 3, wherein transistors comprise said switches.

5. A differential output circuit according to claim 1, further comprising a resistance which is interposed between said first and second outputs supplying current to said load and either one of positive and negative poles of said power source, wherein load current flows in common from said first and second outputs, thereby detecting the absolute value of said load current.

* * * * *